US012453258B2

(12) United States Patent
Han et al.

(10) Patent No.: US 12,453,258 B2
(45) Date of Patent: Oct. 21, 2025

(54) DISPLAY PANEL HAVING A FAN-OUT REGION AND DISPLAY DEVICE

(71) Applicant: BOE TECHNOLOGY GROUP CO., LTD., Beijing (CN)

(72) Inventors: Ying Han, Beijing (CN); Yicheng Lin, Beijing (CN); Pan Xu, Beijing (CN); Guoying Wang, Beijing (CN); Xing Zhang, Beijing (CN); Zhan Gao, Beijing (CN); Mingi Chu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 3 days.

(21) Appl. No.: 17/789,852

(22) PCT Filed: Jun. 22, 2021

(86) PCT No.: PCT/CN2021/101448
§ 371 (c)(1),
(2) Date: Jun. 29, 2022

(87) PCT Pub. No.: WO2022/266830
PCT Pub. Date: Dec. 29, 2022

(65) Prior Publication Data
US 2024/0179969 A1    May 30, 2024

(51) Int. Cl.
*H10K 59/131*    (2023.01)
*H10D 86/00*    (2025.01)
*H10H 20/857*    (2025.01)

(52) U.S. Cl.
CPC ........... *H10K 59/131* (2023.02); *H10D 86/00* (2025.01); *H10H 20/857* (2025.01); *G09G 2310/0275* (2013.01)

(58) Field of Classification Search
CPC .... H10H 20/857; H10D 86/00; H10K 59/131; G09G 2310/0275
See application file for complete search history.

(56) References Cited

U.S. PATENT DOCUMENTS 8,975,761 B2 *  3/2015  Jung ..................... H10K 59/131
                                              345/55
10,923,010 B2 *  2/2021  Kim ......................... G09G 3/20
(Continued)

FOREIGN PATENT DOCUMENTS

CN    105932029 A    9/2016
CN    106873276 A    6/2017
(Continued)

OTHER PUBLICATIONS

Leng et al., CN108598142A, machine translation, Sep. 2018 (Year: 2018).*
(Continued)

*Primary Examiner* — Tracie Y Green
(74) *Attorney, Agent, or Firm* — Dority & Manning, P.A.

(57) ABSTRACT

A display panel has a display region, a fan-out region located on a side of the display region, and a bonding region located on a side of the fan-out region away from the display region. The display panel includes a gate driving circuit disposed in the display region, a plurality of data lines and a plurality of control signal lines that all extends from the display region to the fan-out region, and a plurality of data fan-out leads and a plurality of first fan-out leads that are all disposed in the fan-out region. Each data line is electrically connected to a data fan-out lead. The data fan-out leads are gathered to the bonding region. The control signal lines are electrically connected to the gate driving circuit. Each control signal line is electrically connected to a first fan-out lead. The first fan-out leads are gathered to the bonding region.

19 Claims, 6 Drawing Sheets

(56) References Cited

U.S. PATENT DOCUMENTS

| | | | |
|---|---|---|---|
| 2010/0025690 | A1 | 2/2010 | Kim et al. |
| 2017/0116929 | A1 | 4/2017 | Hirakata |
| 2018/0286316 | A1 | 10/2018 | Yuki et al. |
| 2019/0049805 | A1 | 2/2019 | Chen |
| 2019/0392916 | A1* | 12/2019 | Gu ............................ G09G 3/20 |
| 2022/0309986 | A1* | 9/2022 | Zhu ...................... G09G 3/2092 |
| 2022/0392993 | A1 | 12/2022 | Wang et al. |
| 2023/0141363 | A1* | 5/2023 | Li ........................ H10K 59/131 |
| | | | 257/40 |
| 2024/0038948 | A1* | 2/2024 | Cheng ................... H01L 25/167 |

FOREIGN PATENT DOCUMENTS

| | | |
|---|---|---|
| CN | 107085333 A | 8/2017 |
| CN | 107219660 A | 9/2017 |
| CN | 107331294 A | 11/2017 |
| CN | 107422509 A | 12/2017 |
| CN | 108415601 A | 8/2018 |
| CN | 108598142 A | 9/2018 |
| CN | 109559667 A | 4/2019 |
| CN | 109658837 A | 4/2019 |
| CN | 110579917 A | 12/2019 |
| CN | 210223509 U | 3/2020 |
| CN | 111258141 A | 6/2020 |
| CN | 111341209 A | 6/2020 |
| CN | 111522463 A | 8/2020 |
| CN | 111554194 A | 8/2020 |
| CN | 111798755 A | 10/2020 |

OTHER PUBLICATIONS

Liu et al., CN109559667A, machine translation, Apr. 2019 (Year: 2019).*

Chinese Office Action (w/ English translation) for corresponding CN Application No. 202180001572.X, dated Nov. 15, 2024, 20 pages.

* cited by examiner

DISPLAY PANEL HAVING A FAN-OUT REGION AND DISPLAY DEVICE

CROSS-REFERENCE TO RELATED APPLICATION

This application is a national phase entry under 35 USC 371 of International Patent Application No. PCT/CN 2021/101448 filed on Jun. 22, 2021, which is incorporated herein by reference in its entirety.

TECHNICAL FIELD

The present disclosure relates to the field of display technologies, and in particular, to a display panel and a display device.

BACKGROUND

With the development of display technologies, organic light-emitting diode (OLED) display devices improve people's viewing experiences due to their characteristics of high screen-to-body ratio and narrow bezel, and are favored by more and more consumers.

A screen-to-body ratio of an OLED display device is improved by reducing a width of a bezel of the OLED display device, so as to realize a full screen of a display screen. Moreover, in a spliced display screen formed by splicing full screens, a width of a splicing seam may be reduced to improve an integrity of a display image of the spliced display screen.

SUMMARY

In an aspect, a display panel is provided. The display panel has a display region, a fan-out region located on a side of the display region, and a bonding region located on a side of the fan-out region away from the display region.

The display panel includes a gate driving circuit disposed in the display region, a plurality of data lines, a plurality of data fan-out leads, a plurality of control signal lines and a plurality of first fan-out leads. The plurality of data lines extend from the display region to the fan-out region. The plurality of data fan-out leads are disposed in the fan-out region. Each data line is electrically connected to a data fan-out lead. The plurality of data fan-out leads are gathered to the bonding region. The plurality of control signal lines are electrically connected to the gate driving circuit, and are configured to transmit respective control signals to the gate driving circuit. The plurality of control signal lines extend from the display region to the fan-out region. The plurality of first fan-out leads are disposed in the fan-out region. Each control signal line is electrically connected to a first fan-out lead. The plurality of first fan-out leads are gathered to the bonding region.

In some embodiments, an end of the control signal line extending to the fan-out region is electrically connected to the first fan-out lead.

In some embodiments, the display panel further includes a supply voltage bus disposed in the fan-out region and extending in a first direction. The first direction is substantially perpendicular to a direction from the display region the fan-out region. The first fan-out leads and the supply voltage bus are made of a same material, and are arranged in a same layer. The first fan-out lead bypasses one of two opposite sides of the supply voltage bus in the first direction, and extends to a side of the supply voltage bus away from the display region.

In some embodiments, the display panel further includes a plurality of connection lines disposed between the supply voltage bus and the display region and extending in the first direction. The control signal line is electrically connected to the first fan-out lead through a connection line of the plurality of connection lines.

In some embodiments, the display panel includes a gate conductive layer and a source-drain conductive layer. The plurality of first fan-out leads, the plurality of connection lines and the supply voltage bus are disposed in the gate conductive layer. The source-drain conductive layer is disposed on a side of the gate conductive layer away from a substrate of the display panel. The plurality of control signal lines, the plurality of data lines and the plurality of data fan-out leads are disposed in the source-drain conductive layer.

In some embodiments, the display panel further includes a first insulating layer disposed between the gate conductive layer and the source-drain conductive layer. The first insulating layer is provided with first vias therein. The control signal line is electrically connected to the connection line through a first via of the first vias.

In some embodiments, orthographic projections of the plurality of first fan-out leads on the substrate are staggered from orthographic projections of the plurality of data fan-out leads on the substrate.

In some embodiments, the display panel further includes a supply voltage bus disposed in the fan-out region and extending in a first direction. The first direction is substantially perpendicular to a direction from the display region the fan-out region. At least a portion of the first fan-out lead is arranged in a different layer from the supply voltage bus and the data fan-out leads. An orthographic projection of the first fan-out lead on a substrate of the display panel is partially overlapped with an orthographic projection of the supply voltage bus on the substrate, and is partially overlapped with an orthographic projection of at least one data fan-out lead on the substrate.

In some embodiments, the first fan-out lead includes a first lead segment and a second lead segment that are electrically connected to each other. The control signal line is electrically connected to an end of the first lead segment away from the second lead segment. An end of the second lead segment away from the first lead segment extends to the bonding region.

In some embodiments, at least one first lead segment includes a first sub-lead segment and a second sub-lead segment that are electrically connected to each other. The first sub-lead segment extends in the first direction, and the second sub-lead segment extends in a second direction. The second direction is substantially perpendicular to the first direction.

In some embodiments, the display panel includes a gate conductive layer, a source-drain conductive layer and an electrode layer. The supply voltage bus is disposed in the gate conductive layer. The source-drain conductive layer is disposed on a side of the gate conductive layer away from the substrate. The plurality of control signal lines, the plurality of data lines and the plurality of data fan-out leads are disposed in the source-drain conductive layer. The electrode layer is disposed on a side of the source-drain conductive layer away from the substrate. The first lead segment is disposed in the electrode layer, and the second lead segment is disposed in the source-drain conductive layer or the gate conductive layer.

An orthographic projection of the first lead segment on the substrate is partially overlapped with the orthographic projection of the supply voltage bus on the substrate, and is partially overlapped with the orthographic projection of the at least one data fan-out lead on the substrate. An orthographic projection of the second lead segment on the substrate is staggered from orthographic projections of the plurality of data fan-out leads on the substrate.

In some embodiments, the display panel further includes a second insulating layer disposed between the source-drain conductive layer and the electrode layer. The second insulating layer is provided with second vias and third vias therein. The control signal line is electrically connected to the end of the first lead segment away from the second lead segment through a second via of the second vias.

An end of the first lead segment proximate to the second lead segment is electrically connected to the second lead segment through a third via of the third vias; or the display panel further includes a first insulating layer disposed between the gate conductive layer and the source-drain conductive layer, and the first insulating layer is provided with first vias therein. A first via of the first vias is communicated with a third via of the third vias, and an end of the first lead segment proximate to the second lead segment is electrically connected to the second lead segment through the third via and the first via.

In some embodiments, the display panel further has a peripheral region surrounding the display region. The peripheral region includes a first sub-peripheral region, a second sub-peripheral region, a third sub-peripheral region and a fourth sub-peripheral region. The first sub-peripheral region and the second sub-peripheral region are respectively located on two opposite sides of the display region in a first direction. The third sub-peripheral region and the fourth sub-peripheral region are respectively located on two opposite sides of the display region in a second direction. The first direction is substantially perpendicular to the second direction. The fan-out region and the bonding region are located in the fourth sub-peripheral region.

The control signal line includes a first line segment and a second line segment that are electrically connected to each other. Of first line segments of the plurality of control signal lines, some first line segments extend from the third sub-peripheral region, along the first sub-peripheral region, to the fan-out region. Some other first line segments extend from the third sub-peripheral region, along the second sub-peripheral region, to the fan-out region. Second line segments of the plurality of control signal lines extend from the display region to the third sub-peripheral region.

An end of the first line segment is electrically connected to an end of the second line segment extending to the third sub-peripheral region, and another end of the first line segment is electrically connected to the first fan-out lead.

In some embodiments, the plurality of first fan-out leads, the plurality of control signal lines and the plurality of data fan-out leads are made of a same material, and are arranged in a same layer. The plurality of first fan-out leads are disposed on two opposite sides of the plurality of data fan-out leads in the first direction.

In some embodiments, the display panel further includes a supply voltage bus disposed in the fan-out region and extending in the first direction. The first fan-out leads are arranged in a different layer from the supply voltage bus. An orthographic projection of the first fan-out lead on a substrate of the display panel is partially overlapped with an orthographic projection of the supply voltage bus on the substrate.

In some embodiments, the display panel includes a gate conductive layer and a source-drain conductive layer. The supply voltage bus is disposed in the gate conductive layer. The source-drain conductive layer is disposed on a side of the gate conductive layer away from the substrate of the display panel. The plurality of control signal lines, the plurality of data lines, the plurality of data fan-out leads and the plurality of first fan-out leads are disposed in the source-drain conductive layer.

In some embodiments, the display panel further includes a supply voltage bus disposed in the fan-out region and extending in the first direction. The first line segments of the control signal lines, the plurality of first fan-out leads and the supply voltage bus are made of a same material, and are arranged in a same layer. The first fan-out lead bypasses one of two opposite sides of the supply voltage bus in the first direction, and extends to a side of the supply voltage bus away from the display region.

In some embodiments, the display panel includes a gate conductive layer and a source-drain conductive layer. The first line segments, the plurality of first fan-out leads and the supply voltage bus are disposed in the gate conductive layer. The source-drain conductive layer is disposed on a side of the gate conductive layer away from a substrate of the display panel. The second line segments of the control signal lines, the plurality of data lines and the plurality of data fan-out leads are disposed in the source-drain conductive layer.

In some embodiments, the bonding region includes a first sub-bonding region, and two second sub-bonding regions respectively located on two opposite sides of the first sub-bonding region in a first direction. The first direction is substantially perpendicular to a direction from the display region the fan-out region. The plurality of data fan-out leads are gathered to the first sub-bonding region. The plurality of first fan-out leads are divided into two groups, and the two groups of first fan-out leads are gathered to the two second sub-bonding regions, respectively.

In some embodiments, the display panel further includes a plurality of pins configured to be bonded to a flexible printed circuit board. The plurality of pins include a plurality of first pins located in the first sub-bonding region, and a plurality of second pins located in the second sub-bonding regions.

A data fan-out lead of the plurality of data fan-out leads is electrically connected to at least one first pin, and a first fan-out lead of the plurality of first fan-out leads is electrically connected to at least one second pin.

In another aspect, a display device is provided. The display device includes the display panel in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
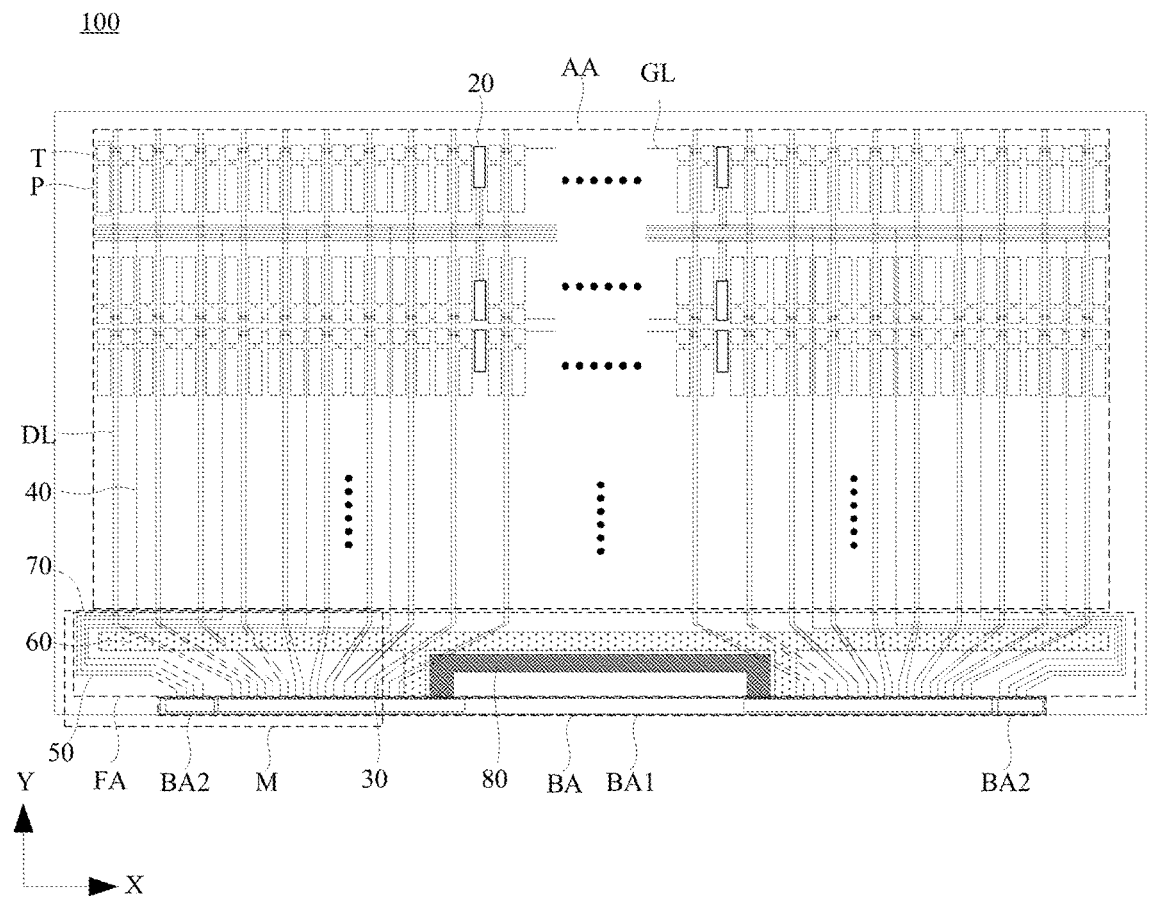
FIG. 1 is a structural diagram of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "electrically connected" and extensions thereof may be used. For example, the term "electrically connected" may be used in the description of some embodiments to indicate that two or more components are in direct physical contact or electrical contact with each other.

The phrase "A and/or B" includes following three combinations: only A, only B, and a combination of A and B.

The use of the phase "configured to" herein means an open and inclusive expression, which does not exclude devices that are applicable to or configured to perform additional tasks or steps.

As used herein, the term such as "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term "same layer" herein means that a film layer for forming a specific pattern is formed by a same film forming process, and then is patterned by one patterning process using a same mask to form a layer structure. Depending on different specific patterns, the one patterning process may include several exposure, development or etching processes, and the specific patterns in the formed layer structure may be continuous or discontinuous, and these specific patterns may also be at different heights or have different thicknesses. On the contrary, the term "different layer" means that a film layer for forming a specific pattern is formed by a corresponding film forming process, and then is patterned by a patterning process using a corresponding mask to form a layer structure. For example, a layer structure is arranged in a different layer from another layer structure, which means that each of the two layer structures is formed by corresponding processes (a film forming process and a patterning process).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, a drive mode of gate driver on array (GOA, also referred to as array substrate row drive) is used in a display panel. That is, gate driving circuit(s) in the display panel are directly integrated in a peripheral region located on at least one side of a display region.

Moreover, the display panel further includes a plurality of signal lines disposed in the peripheral region, and the plurality of signal lines are electrically connected to the gate driving circuit(s) to transmit control signals to the gate driving circuit(s). However, the gate driving circuit(s) and the plurality of signal lines need to occupy a large area of the peripheral region, so that the peripheral region has a large width, which is not conducive to a narrow bezel of a display device to which the display panel is applied.

In order to solve the above problem, some embodiments of the present disclosure provide a display panel. As shown in FIG. 1, the display panel 100 has a display region (i.e., active area, also referred to as effective display region) AA, a fan-out region FA located on a side of the display region AA, and a bonding region BA located on a side of the fan-out region FA away from the display region AA.

As shown in FIG. 1, a plurality of sub-pixels P are provided in the display region AA of the display panel 100. For the convenience of description, as an example, the plurality of sub-pixels P are arranged in a matrix form. In this case, sub-pixels P arranged in a line in a first direction X are referred to as a row of sub-pixels, and sub-pixels P arranged in a line in a second direction Y are referred to as a column of sub-pixels. A row of sub-pixels may be connected to a gate line GL, and a column of sub-pixels may be connected to a data line DL. A sub-pixel P is provided with a pixel driving circuit T therein for controlling the sub-pixel P to display.

As shown in FIG. 1, the display panel 100 includes gate driving circuit(s) 20 disposed in the display region AA. That is, the gate driving circuit(s) 20 are directly integrated in the display region AA of the display panel 100, and the gate driving circuit(s) 20 are gate driver integrated in active array (GIA) circuit(s).

Gate lines GL are electrically connected to the gate driving circuit(s) 20, and a gate line GL is configured to receive a gate scan signal from the gate driving circuit 20 and transmit the gate scan signal to pixel driving circuits T in a row of sub-pixels P in the display region AA. That is, the gate driving circuit(s) 20 are used for driving the gate lines GL.

As shown in FIG. 1, a plurality of data lines DL extend from the display region AA to the fan-out region FA, and a data line DL is configured to transmit a data signal to pixel driving circuits T in a column of sub-pixels located in the display region AA. The display panel 100 further includes a plurality of data fan-out leads 30 disposed in the fan-out region FA. Each data line DL is electrically connected to a data fan-out lead 30, and the plurality of data fan-out leads 30 are gathered to the bonding region BA.

As shown in FIG. 1, the display panel 100 further includes a plurality of control signal lines 40 and a plurality of first fan-out leads 50. The plurality of control signal lines 40 are electrically connected to the gate driving circuit(s) 20, and are configured to transmit respective control signals to the gate driving circuit(s) 20. The plurality of control signal lines 40 extend from the display region AA to the fan-out region FA.

The plurality of first fan-out leads 50 are disposed in the fan-out region FA, and each control signal line 40 is electrically connected to a first fan-out lead. The plurality of first fan-out leads 50 are gathered to the bonding region BA.

It will be noted that FIG. 1 only schematically illustrates an example in which the display panel 100 is provided with two gate driving circuits 20 respectively on two sides of the display region AA in the first direction X, and the gate lines GL are driven by the gate driving circuits 20 from the two sides, i.e., driven in a double-sided manner. In some other embodiments, the display panel 100 may be provided with a gate driving circuit 20 on a single side of the display region AA in the first direction X, and the gate lines GL are driven from the single side, i.e., driven in a single-sided manner.

Following embodiments of the present disclosure will be described by taking the double-sided driving as an example.

In the display panel 100 in the above embodiments of the present disclosure, the gate driving circuit(s) 20 are directly integrated in the display region AA by using a drive mode of GIA, so that an area of the peripheral region of the display panel 100 occupied by the gate driving circuit(s) 20 may be saved, thereby reducing the width the peripheral region, which is conducive to a narrow bezel of a display device to which the display panel 100 is applied.

A specific wiring manner of signal lines in the display panel 100 will be described below with reference to the accompanying drawings.

Figure 4:
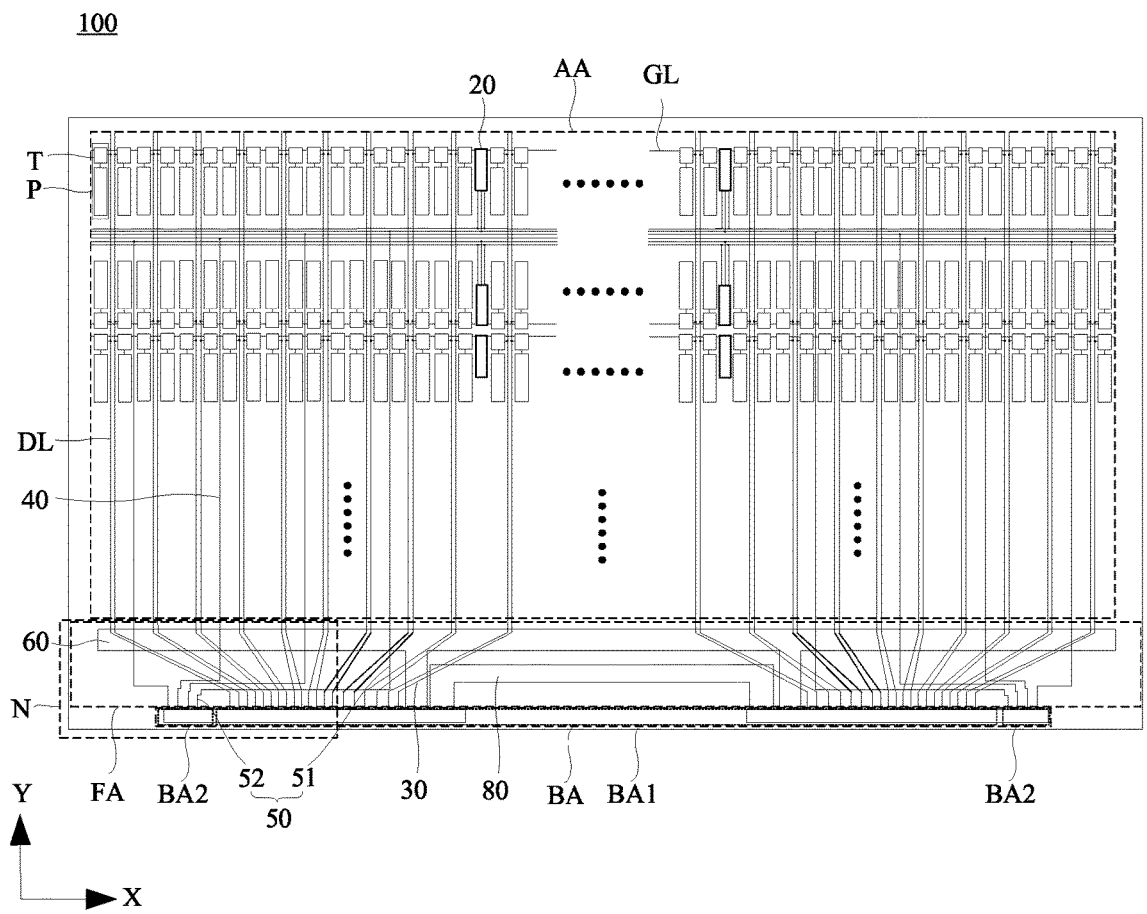
FIG. 4 is a structural diagram of another display panel, in accordance with some embodiments of the present disclosure.

In some embodiments, as shown in FIGS. 1 and 4, the first fan-out lead 50 is electrically connected to an end of the control signal line 40 extending to the fan-out region FA. That is, the control signal line 40 extends from the display region AA to the fan-out region FA, and the end of the control signal line 40 proximate to the fan-out region FA is electrically connected to the first fan-out lead 50. The first fan-out lead 50 and the control signal line 40 need not be disposed in other region(s) outside the display region AA and the fan-out region FA, so that a sum of a length of the control signal line 40 and a length of the first fan-out lead 50 electrically connected thereto is small, and a problem of disconnection of a signal line (formed by electrically connecting the first fan-out lead 50 and the control signal line 40) caused by an overlong length of the signal line may be solved, thereby improving a yield of the signal line.

Figure 2:
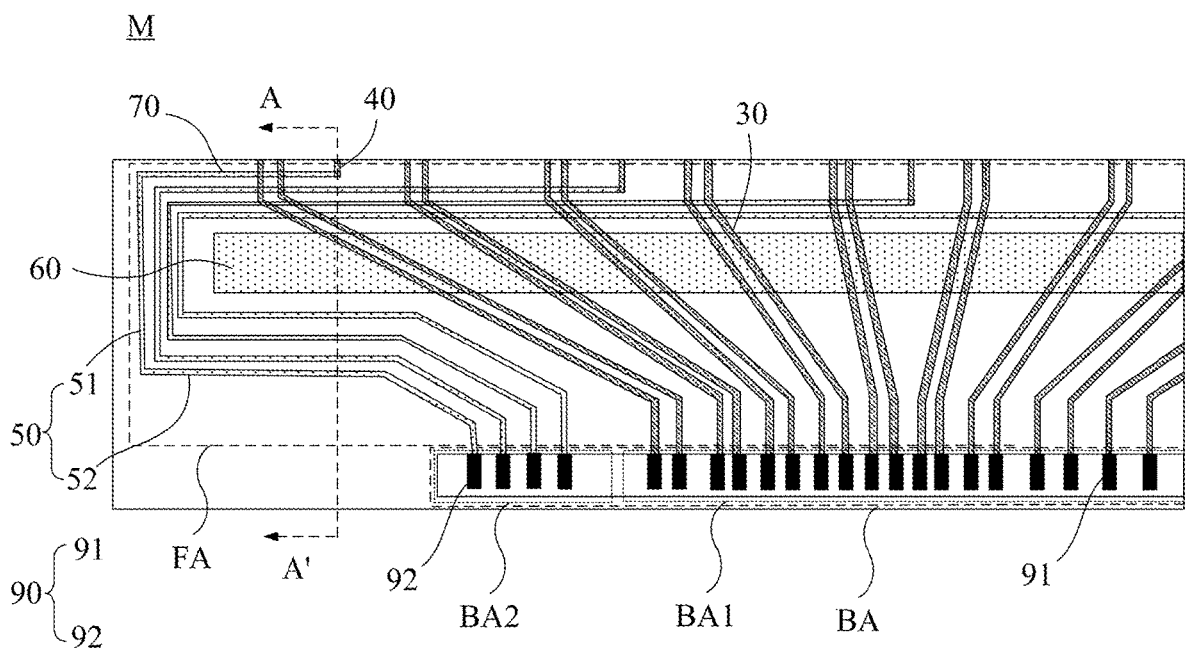
FIG. 2 is a partial enlarged view of the display panel in FIG. 1 at M.

In some embodiments, FIGS. 1 and 2 show a wiring manner. The display panel 100 includes a supply voltage bus 60 disposed in the fan-out region FA, and the supply voltage bus 60 extends in the first direction X. The supply voltage bus 60 is configured to transmit a first supply voltage signal.

The first fan-out leads 50 and the supply voltage bus 60 are made of a same material, and are arranged in a same layer. The first fan-out lead 50 bypasses one of two opposite sides of the supply voltage bus 60 in the first direction X, and extends to a side of the supply voltage bus 60 away from the display region AA.

It will be noted that as shown in FIG. 1, the supply voltage bus 60 extends generally in the first direction X. The supply voltage bus 60 includes a main line segment extending in the first direction X, and branch line segment(s) electrically connected to the main line segment and extending to a first sub-bonding region BA1.

For example, as shown in FIG. 2, the first fan-out lead 50 includes a first lead segment 51 extending in the second direction Y, and a second lead segment 52 extending in the first direction X and electrically connected to the first lead segment 51. The first lead segment 51 of the first fan-out lead 50 is located on one of the two opposite sides of the supply voltage bus 60 in the first direction X, and the second lead segment 52 of the first fan-out lead 50 extends to the side of the supply voltage bus 60 away from the display region AA.

By using the above wiring manner of the first fan-out leads 50, the first fan-out leads 50 are insulated from the supply voltage bus 60, and the first fan-out leads 50 need not be disposed in other region(s) outside the fan-out region FA, so that the first fan-out lead 50 has a small length, and a problem of disconnection of the first fan-out lead 50 caused by an overlong length of the first fan-out lead 50 may be solved, thereby improving a yield of the first fan-out lead 50.

In some embodiments, as shown in FIGS. 1 and 2, the display panel 100 further includes a plurality of connection lines (i.e., first connection lines below) 70. The plurality of first connection lines 70 are disposed between the supply voltage bus 60 and the display region AA, and extend in the first direction X. FIG. 1 shows a case that the first connection lines 70 are disposed in the fan-out region FA. The control signal line 40 is electrically connected to a corresponding first fan-out lead 50 through a first connection line 70, so as to realize transmission of a control signal between the control signal line 40 and the corresponding first fan-out lead 50.

Figure 3:
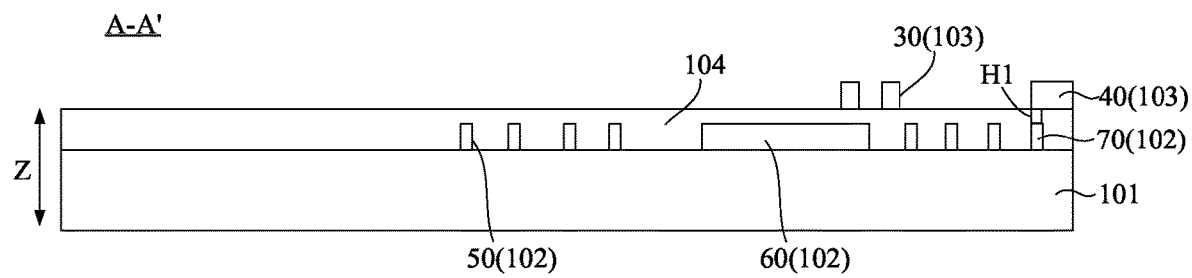
FIG. 3 is a sectional view of the display panel in FIG. 2 taken along the A-A' section line.

In some embodiments, FIG. 3 is a sectional view of the display panel 100 in FIG. 2 taken along the A-A' section line. The display panel 100 includes a gate conductive layer (i.e., first gate conductive layer below) 102 and a source-drain conductive layer 103, and the source-drain conductive layer 103 is disposed on a side of the first gate conductive layer 102 away from a substrate 101 of the display panel 100.

The plurality of first fan-out leads 50, the plurality of first connection lines 70 and the supply voltage bus 60 are disposed in the first gate conductive layer 102. That is, the plurality of first fan-out leads 50, the plurality of first connection lines 70 and the supply voltage bus 60 are arranged in the same layer. The plurality of control signal lines 40, the plurality of data lines DL and the plurality of data fan-out leads 30 are disposed in the source-drain conductive layer 103. That is, the plurality of control signal lines 40, the plurality of data lines DL and the plurality of data fan-out leads 30 are arranged in the same layer.

It will be understood that since the plurality of first fan-out leads 50 and the plurality of first connection lines 70 are arranged in the same layer, the first connection line 70 is directly electrically connected to a corresponding first fan-out lead 50. Similarly, since the plurality of data lines DL and the plurality of data fan-out leads 30 are arranged in the same layer, the data line DL is directly electrically connected to a corresponding data fan-out lead 30.

In some embodiments, as shown in FIG. 3, the display panel 100 further includes a first insulating layer 104. The first insulating layer 104 is disposed between the first gate conductive layer 102 and the source-drain conductive layer 103, and first vias H1 are provided in the first insulating layer 104. The first connection line 70 is electrically connected to a corresponding control signal line 40 through a first via H1, so as to realize transmission of a control signal between the control signal line 40 and the corresponding first connection line 70.

It will be noted that a manufacturing process of the display panel 100 includes: sequentially manufacturing the first gate conductive layer 102, the first insulating layer 104 and the source-drain conductive layer 103 on the substrate 101. It can be seen from the above that the plurality of first connection lines 70 are disposed in the first gate conductive layer 102, and the plurality of control signal lines 40 are disposed in the source-drain conductive layer 103. That is, firstly, the plurality of first connection lines 70 are manufactured. Then, the first insulating layer 104 covering the plurality of first connection lines 70 are manufactured, and the first vias H1 for exposing respective first connection lines 70 are provided in the first insulating layer 104. Finally, the plurality of control signal lines 40 are manufactured, and at least a portion of each control signal line 40 is electrically connected to a first connection line 70 in a first via H1, so as to realize a cross-layer electrical connection between the first connection line 70 and a corresponding control signal line 40.

It will be understood that "cross-layer" means across a layer structure. For example, the cross-layer electrical connection between the first connection line 70 and the corresponding control signal line 40 means that the first insulating layer 104 is disposed between the first gate conductive layer 102 and the source-drain conductive layer 103, the plurality of first connection lines 70 are disposed in the first gate conductive layer 102, the plurality of control signal lines 40 are disposed in the source-drain conductive layer 103, and the first connection line 70 is electrically connected to the corresponding control signal line 40 across the first insulating layer 104.

In some embodiments, as shown in FIG. 2, orthographic projections of the plurality of first fan-out leads 50 on the substrate 101 are staggered from orthographic projections of the plurality of data fan-out leads 30 on the substrate 101, so that the first fan-out lead 50 may be prevented from being overlapped with the data fan-out lead 30 in a thickness direction Z of the substrate 101. Thus, an interference between signals transmitted by different signal lines due to a parasitic capacitance generated between the first fan-out lead 50 and the data fan-out lead 30 is avoided.

Figure 5:
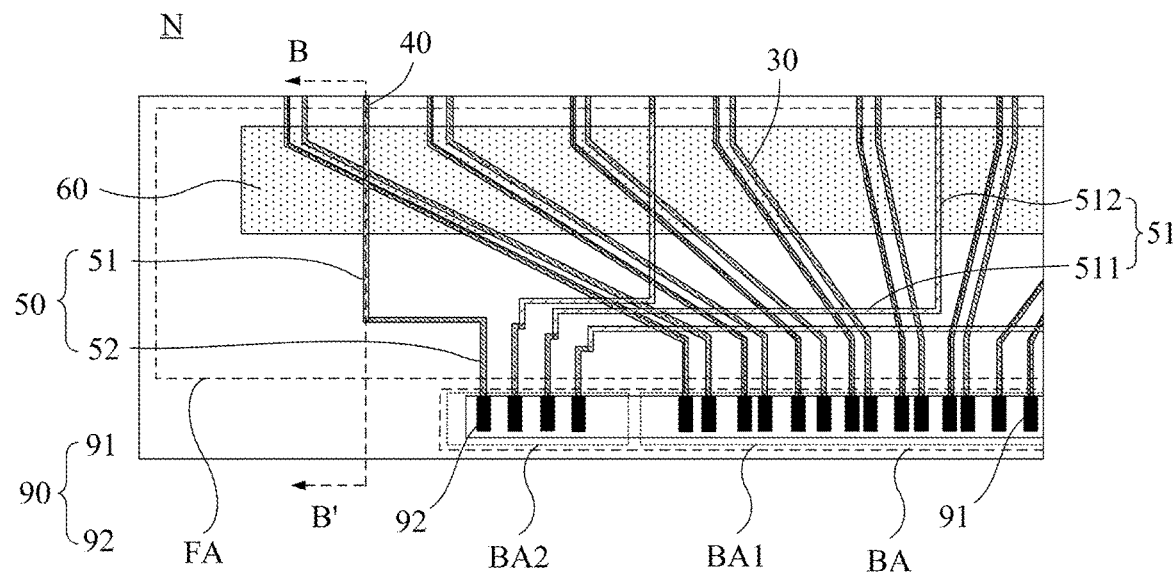
FIG. 5 is a partial enlarged view of the display panel in FIG. 4 at N.

In some embodiments, FIGS. 4 and 5 show another wiring manner. The display panel 100 includes a supply voltage bus 60 disposed in the fan-out region FA, and the supply voltage bus 6 extends in the first direction X.

At least a portion of the first fan-out lead 50 is arranged in a different layer from the supply voltage bus 60 and the data fan-out leads 30. That is, the at least a portion of the first fan-out lead 50 is not in the same layer structure as the supply voltage bus 60 and the data fan-out leads 30. An orthographic projection of the first fan-out lead 50 on the substrate 101 of the display panel 100 is partially overlapped with an orthographic projection of the supply voltage bus 60 on the substrate 101, and is partially overlapped with orthographic projection(s) of at least one data fan-out lead 30 on the substrate 101.

In the above embodiments of the present disclosure, the orthographic projection of the first fan-out lead 50 on the substrate 101 of the display panel 100 is partially overlapped with the orthographic projection of the supply voltage bus 60 on the substrate 101, and is partially overlapped with the orthographic projection(s) of the at least one data fan-out lead 30 on the substrate 101. That is, in the thickness direction Z of the substrate 101, the first fan-out lead 50 is partially overlapped with the supply voltage bus 60, and is partially overlapped with the at least one data fan-out lead 30, so that the first fan-out leads 50 may be gathered to the bonding region BA without bypassing the supply voltage bus 60 and the data fan-out leads 30. Therefore, the length of the first fan-out lead 50 may be further reduced, and the problem of disconnection of the first fan-out lead 50 caused by an overlong length of the first fan-out lead 50 may be solved, thereby improving the yield of the first fan-out lead 50.

Moreover, since the length of the first fan-out lead 50 is reduced, and an area of the fan-out region FA occupied by the first fan-out leads 50 is not increased, a width of a portion of the bezel of the display device corresponding to the fan-out region FA is not increased.

In some embodiments, as shown in FIGS. 4 and 5, the first fan-out lead 50 includes a first lead segment 51 and a second lead segment 52 that are electrically connected to each other. An end of the first lead segment 51 away from the second lead segment 52 is electrically connected to the control signal line 40. An end of the second lead segment 52 away from the first lead segment 51 extends to the bonding region BA (i.e., a second sub-bonding region BA2).

It will be understood that of the first lead segment 51 and the second lead segment 52 included in the first fan-out lead 50, the first lead segment 51 is used to be electrically connected to the control signal line 40, so as to realize the electrical connection between the first fan-out lead 50 and the control signal line 40. The second lead segment 52 extends to the second sub-bonding region BA2, thereby realizing that the plurality of first fan-out leads 50 are gathered to the second sub-bonding region(s) BA2.

In some embodiments, as shown in FIG. 5, at least one first lead segment 51 includes a first sub-lead segment 511 and a second sub-lead segment 512 that are electrically connected to each other. The first sub-lead segment 511 extends in the first direction X, and the second sub-lead segment 512 extends in the second direction Y. The second direction Y is substantially perpendicular to the first direction X.

It will be understood that in combination with FIG. 5, of the plurality of control signal lines 40, some control signal lines 40 are close to the second sub-bonding region BA2, some control signal lines 40 are away from the second sub-bonding region BA2. First fan-out leads 50, which are electrically connected to respective control signal lines 40 away from the second sub-bonding region BA2, need to be gathered to the second sub-bonding region BA2 across data fan-out leads 30. Therefore, for the first fan-out leads 50 that are electrically connected to respective control signal lines 40 away from the second sub-bonding region BA2, the first lead segment 51 of the first fan-out lead 50 is provided with the first sub-lead segment 511 and the second sub-lead segment 512. The first sub-lead segment 511 extends in the first direction X, and is electrically connected to the second lead segment 52 across the data fan-out leads 30, so as to realize the electrical connection between the first lead segment 51 and the second lead segment 52.

Figure 6:
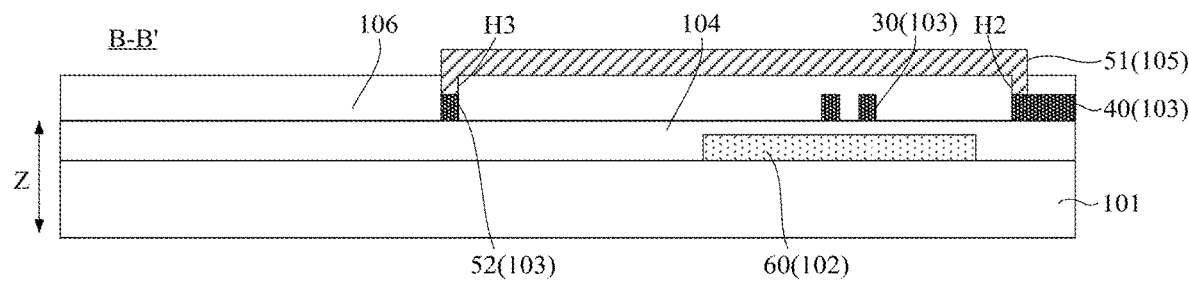
FIG. 6 is a sectional view of the display panel in FIG. 5 taken along the B-B' section line.

In some embodiments, FIG. 6 is a sectional view of the display panel 100 in FIG. 5 taken along the B-B' section line. The display panel 100 includes a gate conductive layer (i.e., first gate conductive layer below) 102, a source-drain conductive layer 103 and an electrode layer (i.e., first electrode layer below) 105 that are sequentially stacked. The source-drain conductive layer 103 is disposed on a side of the first gate conductive layer 102 away from a substrate 101 of the display panel 100. The first electrode layer 105 is disposed on a side of the source-drain conductive layer 103 away from the substrate 101 of the display panel 100.

The supply voltage bus 60 is disposed in the first gate conductive layer 102. The plurality of control signal lines 40, the plurality of data lines DL and the plurality of data fan-out leads 30 are disposed in the source-drain conductive layer 103. That is, the plurality of control signal lines 40, the plurality of data lines DL and the plurality of data fan-out leads 30 are arranged in the same layer. First lead segments 51 of the plurality of first fan-out leads 50 are disposed in the first electrode layer 105. Second lead segments 52 of the plurality of first fan-out leads 50 are disposed in the source-drain conductive layer 103 or the first gate conductive layer 102.

It will be understood that since the plurality of data lines DL and the plurality of data fan-out leads 30 are arranged in the same layer, the data line DL is directly electrically connected to a corresponding data fan-out lead 30.

As shown in FIGS. 4 and 5, an orthographic projection of the first lead segment 51 on the substrate 101 is partially overlapped with the orthographic projection of the supply voltage bus 60 on the substrate 101, and is partially overlapped with the orthographic projection(s) of the at least one data fan-out lead 30 on the substrate 101. That is, in the thickness direction Z of the substrate 101, the first lead segment 51 is partially overlapped with the supply voltage bus 60, and is partially overlapped with the at least one data fan-out lead 30, so that the first lead segment 51 need not bypass the supply voltage bus 60 and the data fan-out leads 30. Therefore, a length of the first lead segment 51 may be reduced to reduce the length of the first fan-out lead 50, and the problem of disconnection of the first fan-out lead 50 caused by an overlong length of the first fan-out lead 50 may be solved, thereby improving the yield of the first fan-out lead 50.

Moreover, since the length of the first lead segment 51 is reduced such that the length of the first fan-out lead 50 is reduced, and an area of the fan-out region FA occupied by the first fan-out leads 50 is not increased, the width of the portion of the bezel of the display device corresponding to the fan-out region FA is not increased.

As shown in FIGS. 4 and 5, orthographic projections of the second lead segments 52 on the substrate 101 are staggered from the orthographic projections of the plurality of data fan-out leads 30 on the substrate 101, so that the second lead segment 52 may be prevented from being overlapped with the data fan-out lead 30 in the thickness direction Z of the substrate 101. Thus, an interference between signals transmitted by different signal lines due to a parasitic capacitance generated between the second lead segment 52 of the first fan-out lead 50 and the data fan-out lead 30 is avoided.

In some embodiments, as shown in FIG. 6, the display panel 100 further includes a second insulating layer 106. The second insulating layer 106 is disposed between the source-drain conductive layer 103 and the first electrode layer 105, and second vias H2 and third vias H3 are provided in the second insulating layer 106.

The end of the first lead segment 51 away from the second lead segment 52 is electrically connected to a corresponding control signal line 40 through a second via H2. It will be understood that the second vias H2 for exposing respective control signal line 40 are disposed in the second insulating layer 106, and at least a portion of each first lead segment 51 is electrically connected to a control signal line 40 in a second via H2, so as to realize a cross-layer electrical connection between the first lead segment 51 and a corresponding control signal line 40.

As shown in FIG. 6, in a case where the second lead segments 52 are disposed in the source-drain conductive layer 103, an end of the first lead segment 51 proximate to the second lead segment 52 is electrically connected to the second lead segment 52 through a third via H3. It will be understood that the third vias H3 for exposing respective second lead segments 52 are disposed in the second insulating layer 106, and at least a portion of each first lead segment 51 is electrically connected to a second lead segment 52 in a third via H3, so as to realize a cross-layer electrical connection between the first lead segment 51 and a corresponding second lead segment 52.

Figure 7:
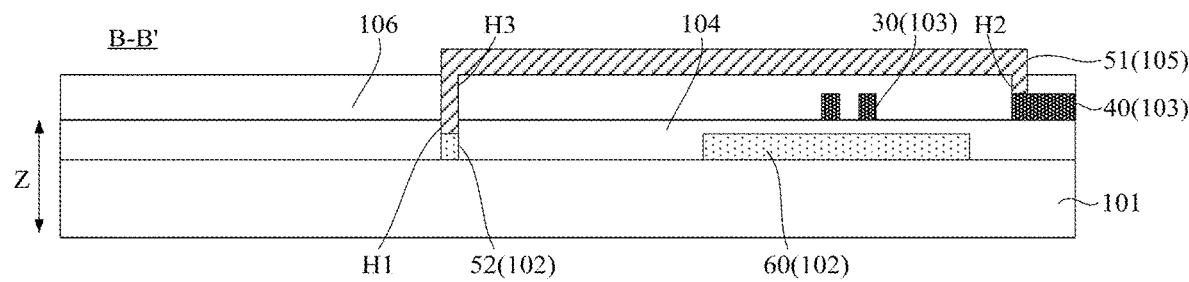
FIG. 7 is anther sectional view of the display panel in FIG. 5 taken along the B-B' section line.

Alternatively, as shown in FIG. 7, the display panel 100 further includes a first insulating layer 104. The first insulating layer 104 is disposed between the first gate conductive layer 102 and the source-drain conductive layer 103, and first vias H1 are provided in the first insulating layer 104.

It will be noted that vias in the first insulating layer 104 are collectively referred to as first vias H1. It can be seen from FIGS. 3 and 7 that a first via H1 in FIG. 3 is different from a first via H1 in FIG. 7. That is, a position of the first via H1 in FIG. 3 in the first insulating layer 104 is different from a position of the first via H1 in FIG. 7 in the first insulating layer 104.

In a case where the second lead segments 52 are disposed in the first gate insulating layer 102, and the first via H1 is communicated with the third via H3, the end of the first lead segment 51 proximate to the second lead segment 52 is electrically connected to the second lead segment 52 through the third via H3 and the first via H1. It will be understood that the first via H1 is communicated with the third via H3 to expose the second lead segment 52, and at least a portion of each first lead segment is electrically connected to a second lead segment 52 in a via formed by the first via H1 and the third via H3, so as to realize a cross-layer electrical connection between the first lead segment 51 and a corresponding second lead segment 52.

Figure 8:
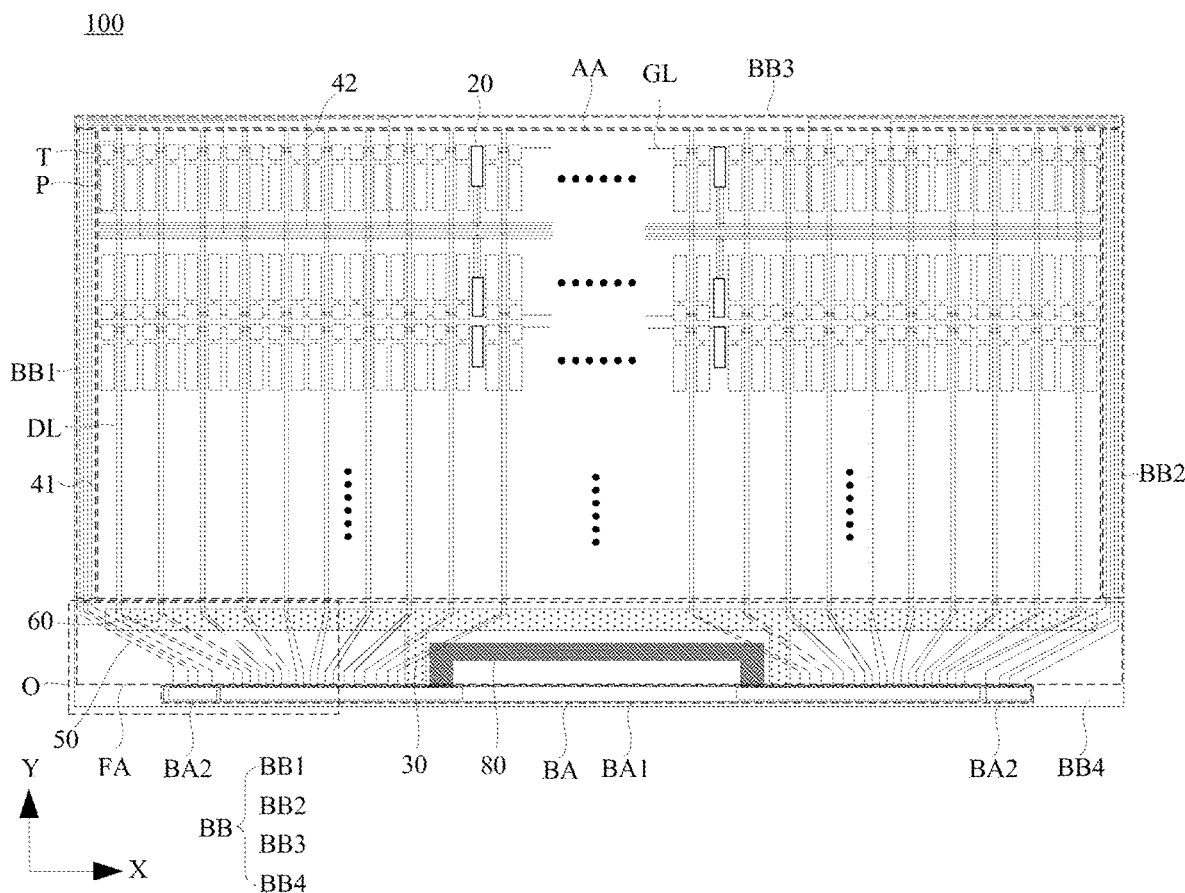
FIG. 8 is a structural diagram of yet another display panel, in accordance with some embodiments of the present disclosure.
Figure 9:
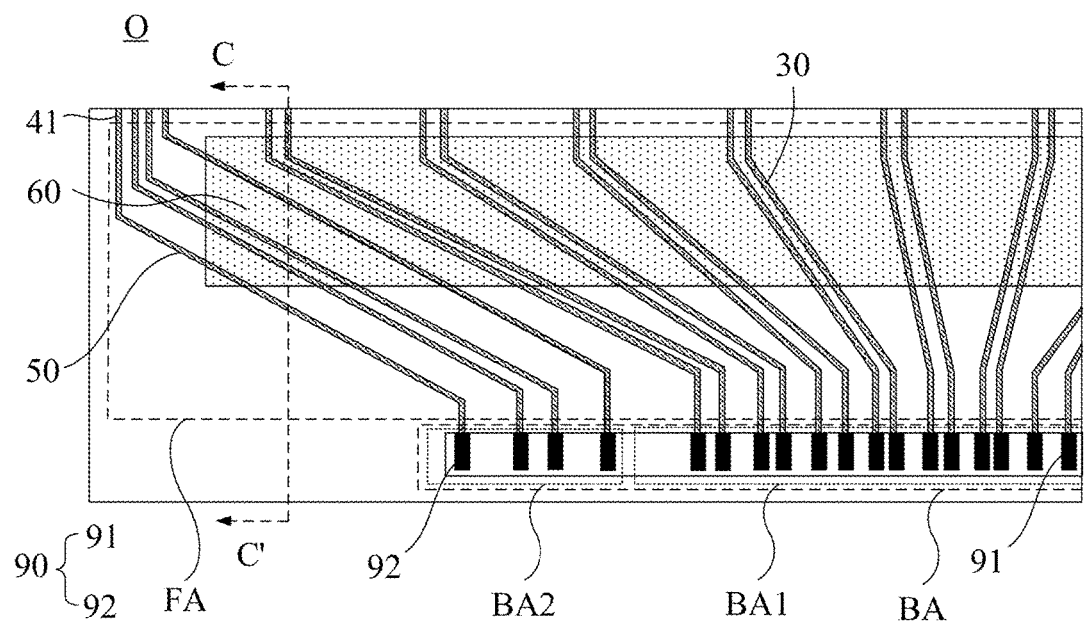
FIG. 9 is a partial enlarged view of the display panel in FIG. 8 at O.

In some embodiments, FIGS. 8 and 9 show yet another wiring manner. The display panel 100 further has a peripheral region BB surrounding the display region AA. The peripheral region BB includes a first sub-peripheral region BB1, a second sub-peripheral region BB2, a third sub-peripheral region BB3 and a fourth sub-peripheral region BB4. The first sub-peripheral region BB1 and the second sub-peripheral region BB2 are located on two opposite sides of the display region AA in the first direction X, respectively. The third sub-peripheral region BB3 and the fourth sub-peripheral region BB4 are located on two opposite sides of the display region AA in the second direction Y, respectively. The first direction X is substantially perpendicular to the second direction Y.

The fan-out region FA and the bonding region BA described above are located in the fourth sub-peripheral region BB4. That is, the fan-out region FA and the bonding region BA also belong to the peripheral region BB of the display panel 100, and belong to the fourth sub-peripheral region BB4 of the peripheral region BB.

As shown in FIGS. 8 and 9, the control signal line 40 includes a first line segment 41 and a second line segment 42 that are electrically connected to each other. Of first line segments 41 of the plurality of control signal lines 40, some first line segments 41 extend from the third sub-peripheral region BB3, along the first sub-peripheral region BB1, to the fan-out region FA1. Some other first line segments 41 extend from the third sub-peripheral region BB3, along the second sub-peripheral region BB2, to the fan-out region FA. Second line segments 42 of the plurality of control signal lines 40 extend from the display region AA to the third sub-peripheral region BB3.

An end of the first line segment 41 is electrically connected to an end of the second line segment 42 extending to the third sub-peripheral region BB3, and another end of the first line segment 41 is electrically connected to a corresponding first fan-out lead 50.

In the above embodiments of the present disclosure, the control signal lines 40 extend from the display region AA to the third sub-peripheral region BB3. Some control signal lines 40 extend from the third sub-peripheral region BB3, along the first sub-peripheral region BB1, to the fan-out region FA, and some other control signal lines 40 extend from the third sub-peripheral region BB3, along the second sub-peripheral region BB2, to the fan-out region FA. That is, the control signal line 40 is led out from a side of the display region AA away from the fan-out region FA in the second direction Y to the third sub-peripheral region BB3, and extend to the fan-out region FA along the first sub-peripheral region BB1 or the second sub-peripheral region BB2.

By using the above wiring design, the control signal line 40 may have a large length, and a resistance of the control signal line 40 may be increased, which is conducive to reducing a ratio of a difference between resistances of different control signal lines 40 and a resistance of each control signal line 40. Thus, a difference in voltage drop (IR-Drop) generated by transmission of control signals by different control signal lines 40 is reduced, so as to reduce horizontal stripes on a display screen of the display device.

In addition, by using the above wiring design, widths of the sub-peripheral regions are not increased due to the control signal lines 40, and an arrangement region of the control signal lines 40 in the peripheral region BB corresponds to an encapsulation bezel of the display device. Therefore, a width of the encapsulation bezel of the display device is not increased due to the control signal lines 40.

In some embodiments, as shown in FIGS. 8 and 9, the plurality of first fan-out leads 50, the plurality of control signal lines 40 and the plurality of data fan-out leads 30 are made of a same material, and are arranged in a same layer. The plurality of first fan-out leads 50 are disposed on two opposite sides of the plurality of data fan-out leads 30 in the first direction X.

By using the above wiring manner of the first fan-out leads 50, the first fan-out leads 50 are insulated from the data fan-out leads 30. Moreover, the first fan-out leads 50 and the data fan-out leads 30 are compactly arranged in the first direction X, so that a utilization rate of an area of the fan-out region FA may be improved, thereby reducing a width of the fan-out region FA in the first direction X, which is conducive to the narrow bezel of the display device to which the display panel 100 is applied.

In some embodiments, as shown in FIGS. 8 and 9, the display panel 100 further includes a supply voltage bus 60 disposed in the fan-out region FA, and the supply voltage bus 60 extends in the first direction X.

The first fan-out leads 50 are arranged in a different layer from the supply voltage bus 60. An orthographic projection of the first fan-out lead 50 on the substrate 101 of the display panel 100 is partially overlapped with an orthographic projection of the supply voltage bus 60 on the substrate 101, so that the area of the fan-out region FA occupied by the first fan-out leads 50 may be reduced, which is conducive to reducing the width of the fan-out region FA in the first direction X, and is conducive to the narrow bezel of the display device to which the display panel 100 is applied.

Figure 10:
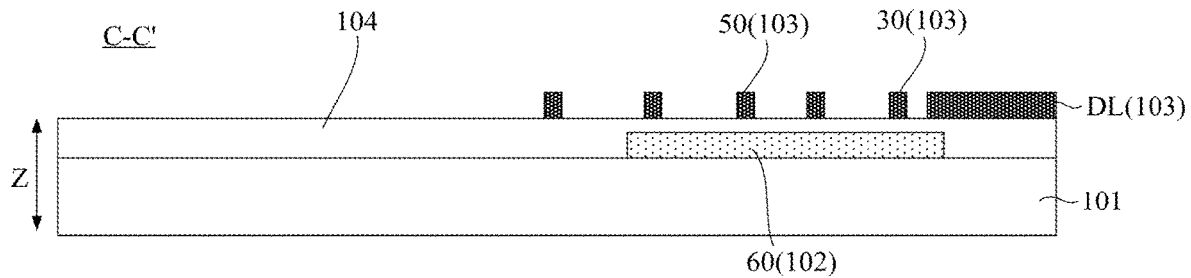
FIG. 10 is a sectional view of the display panel in FIG. 9 taken along the C-C' section line.

In some embodiments, FIG. 10 shows a sectional view of the display panel 100 in FIG. 9 taken along the C-C' section line. The display panel 100 includes a gate conductive layer (i.e., first gate conductive layer below) 102 and a source-drain conductive layer 103, and the source-drain conductive layer 103 is disposed on a side of the source-drain conductive layer 103 away from a substrate 101 of the display panel 100.

The supply voltage bus 60 is disposed in the first gate conductive layer 102. The plurality of control signal lines 40, the plurality of data lines DL, the plurality of data fan-out leads 30 and the plurality of first fan-out leads 50 are disposed in the source-drain conductive layer 103. That is, the plurality of control signal lines 40, the plurality of data lines DL, the plurality of data fan-out leads 30 and the plurality of first fan-out leads 50 are arranged in the same layer.

It will be understood that since the plurality of data lines DL and the plurality of data fan-out leads 30 are arranged in the same layer, the data line DL is directly electrically connected to a corresponding data fan-out lead 30. Similarly, since the plurality of control signal lines 40 and the plurality of first fan-out leads 50 are arranged in the same layer, the control signal line 40 is directly electrically connected to a corresponding first fan-out lead 50.

Figure 11:
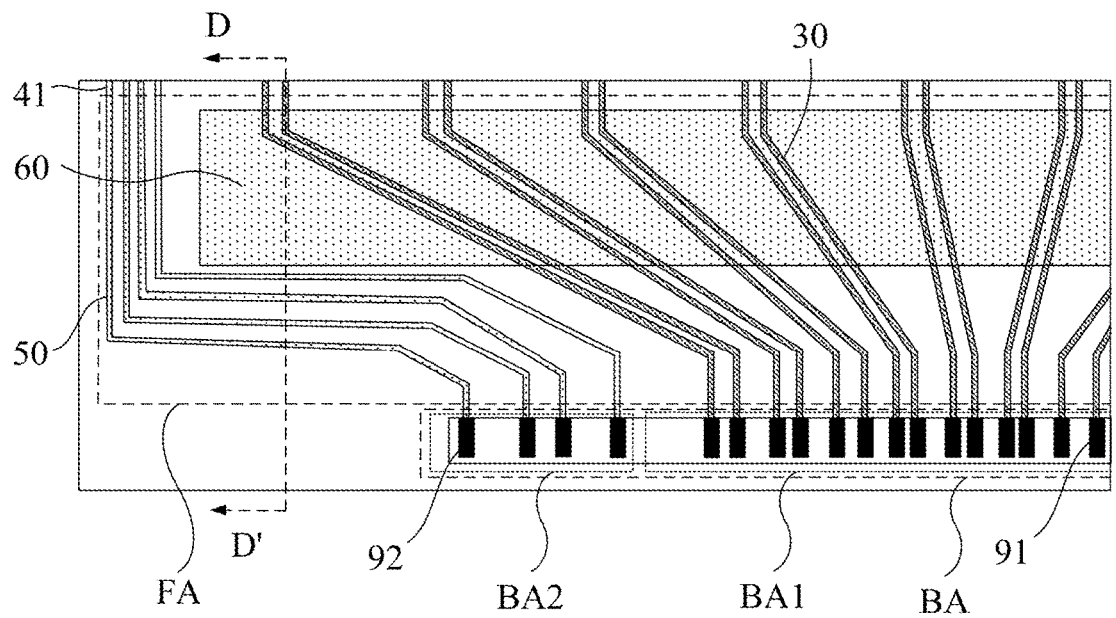
FIG. 11 is a structural diagram of yet another display panel, in accordance with some embodiments of the present disclosure.

As shown in FIG. 11, in some other embodiments, the first line segments 41 of the control signal lines 40, the plurality of first fan-out leads 50 and the supply voltage bus 60 are made of a same material, and are arranged in a same layer. The first fan-out lead 50 bypasses one of two opposite sides of the supply voltage bus 60 in the first direction X, and extends to a side of the supply voltage bus 60 away from the display region AA.

By using the wiring manner of the first fan-out leads 50, the first fan-out leads 50 are insulated from the supply voltage bus 60. Moreover, the first fan-out leads 50 and the supply voltage bus 60 are compactly arranged in the first direction X, so that utilization rate of the area of the fan-out region FA may be improved, thereby reducing the width of the fan-out region FA in the first direction X, which is conducive to the narrow bezel of the display device to which the display panel 100 is applied.

Figure 12:
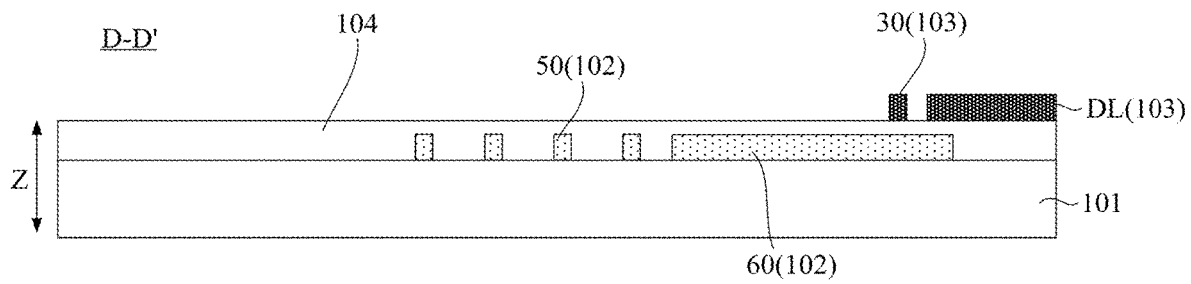
FIG. 12 is a sectional view of the display panel in FIG. 11 taken along the D-D' section line.

In some embodiments, as shown in FIGS. 11 and 12, the first lines segment 41, the plurality of first fan-out leads 50 and the supply voltage bus 60 are disposed in the first gate conductive layer 102. The second line segments of the control signal lines 40, the plurality of data lines DL and the plurality of fan-out leads 30 are disposed in the source-drain conductive layer 103.

Since the first line segments 41 of the control signal lines 40 are disposed in the first gate conductive layer 102, and the second line segments 42 of the control signal lines 40 are disposed in the source-drain conductive layer 103, in order to realize the electrical connection between the first line segment 41 and the second line segment 42, in some embodiments, as shown in FIG. 12, the display panel 100 includes a first insulating layer 104 disposed between the first gate conductive layer 102 and the source-drain conductive layer 103. First vias H1 are provided in the first insulating layer 104, and the first line segment 41 is electrically connected to a corresponding second line segment 42 through a first via H1.

It will be noted that vias in the first insulating layer 104 are collectively referred to as first vias H1. It can be seen from FIG. 8 that a position where the first line segment 41 is electrically connected to a corresponding second line segment 42 is located in the third sub-peripheral region BB3. That is, the first insulating layer 104 is provided with the first vias H1 at respective positions of the third sub-peripheral region BB3.

In some embodiments, as shown in FIGS. 1, 4 and 8, the bonding region BA includes the first sub-bonding region BA1 and at least one second sub-bonding region BA2 that are all arranged side by side in the first direction X. The plurality of data fan-out leads 30 are gathered to the first sub-bonding region BA1, and the plurality of first fan-out leads 50 are gathered to the second sub-bonding region(s) BA2.

For example, the display panel 100 is provided with the gate driving circuit 20 on the single side of the display region AA in the first direction X, and the gate lines GL are driven from the single side, i.e., driven in the single-sided manner. In this case, the bonding region BA includes the first sub-bonding region BA1 and the second sub-bonding region BA2 arranged side by side in the first direction X. The plurality of data fan-out leads 30 are gathered to the first sub-bonding region BA1, and the plurality of first fan-out leads 50 are gathered to the second sub-bonding region BA2.

In the above embodiments of the present disclosure, the first sub-bonding region BA1 and the second sub-bonding region BA2 are arranged side by side, the plurality of data fan-out leads 30 are gathered to the first sub-bonding region BA1, and the plurality of first fan-out leads 50 are gathered to the second sub-bonding region BA2. Therefore, a region where the first fan-out leads 50 are gathered is located on a side of a region where the plurality of data fan-out leads 30 are gathered in the first direction X, so that the first fan-out leads 50 and the data fan-out leads 30 are compactly arranged in the fan-out region FA, and the utilization rate of the area of the fan-out region FA may be improved, thereby reducing the width of the fan-out region FA in the first direction X, which is conducive to the narrow bezel of the display device to which the display panel 100 is applied.

In some embodiments, the display panel 100 is provided with the gate driving circuits 20 respectively on the two sides of the display region AA in the first direction X, and the gate lines GL are driven by the gate driving circuits 20 from the two sides, i.e., driven in the double-sided manner. In this case, as shown in FIGS. 1, 4 and 8, the bonding region BA includes the first sub-bonding region BA1 and two second sub-bonding regions BA2 respectively located on two opposite sides of the first sub-bonding region BA1 in the first direction X. The plurality of data fan-out leads 30 are gathered to the first sub-bonding region BA1. The plurality of first fan-out leads 50 are divided into two groups, and the two groups of first fan-out leads 50 are gathered to the two second sub-bonding regions BA2, respectively.

In the above embodiments of the present disclosure, the two second sub-bonding regions BA2 are respectively located on the two opposite sides of the first sub-bonding region BA1 in the first direction X. The plurality of data fan-out leads 30 are gathered to the first sub-bonding region BA1. The plurality of first fan-out leads 50 are divided into the two groups, one group of first fan-out leads 50 are gathered to the second sub-bonding region BA2 located on a side of the first sub-bonding region BA1, and another group of first fan-out leads 50 are gathered to the second sub-bonding region BA2 located on another side of the first sub-bonding region BA1. That is, regions where the two groups of first fan-out leads 50 are gathered are respectively located on two opposite sides of a region where the plurality of data fan-out leads 30 are gathered in the first direction X, so that the first fan-out leads 50 and the data fan-out leads 30 are compactly arranged in the fan-out region FA, and the utilization rate of the area of the fan-out region FA may be improved, thereby reducing the width of the fan-out region FA in the first direction X, which is conducive to the narrow bezel of the display device to which the display panel 100 is applied.

In some embodiments, as shown in FIGS. 1, 4, and 8, the display panel 100 further includes a supply voltage line 80 disposed in the fan-out region FA, and the supply voltage line 80 extends generally in the first direction X. The supply voltage line 80 includes a main line segment extending in the first direction X, and branch line segment(s) electrically connected to the main line segment and extending to the first sub-bonding region BA1. The supply voltage line 80 is configured to transmit a second supply voltage signal.

In some embodiments, as shown in FIGS. 2, 5 and 9, the display panel 100 further includes a plurality of pins 90 configured to be bonded to a flexible printed circuit board. The plurality of pins 90 include a plurality of first pins 91 located in the first sub-bonding region BA1 and a plurality of second pins 92 located in the second sub-bonding region(s) BA2.

Each data fan-out lead 30 is electrically connected to at least one first pin 91, and each first fan-out lead 50 is electrically connected to at least one second pin 92.

For example, as shown in FIGS. 2, 5 and 9, each data fan-out lead 30 is electrically connected to a first pin 91. Each first fan-out lead 50 is electrically connected to a second pin 92.

For example, each data fan-out lead 30 is electrically connected to two first pins 91. Each first fan-out lead 50 is electrically connected to two second pins 92.

Figure 13:
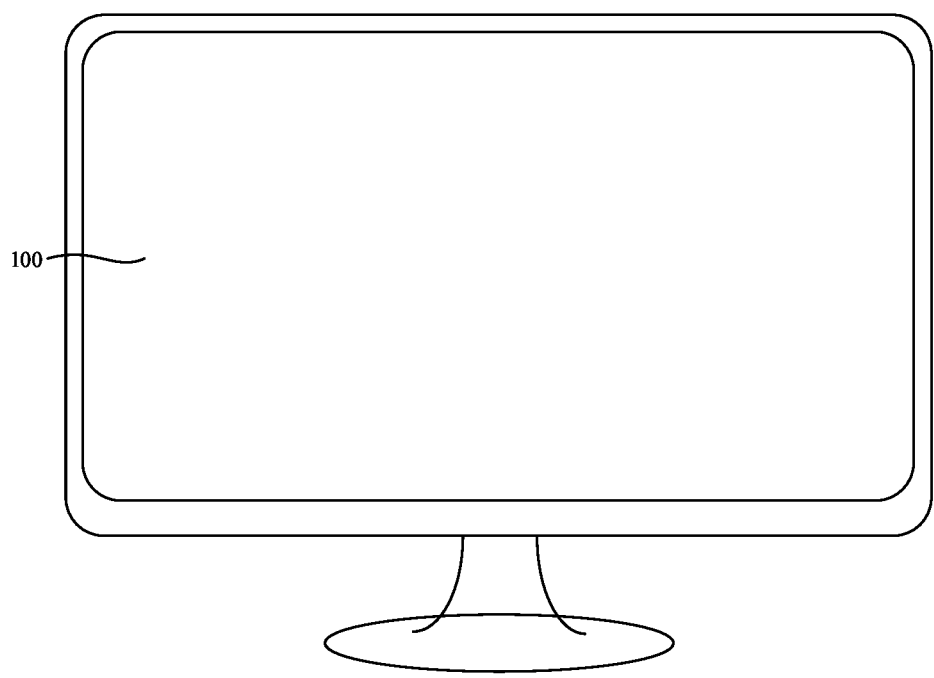
FIG. 13 is a structural diagram of a display device, in accordance with some embodiments of the present disclosure.

Some embodiments of the present disclosure further provide the display device. As shown in FIG. 13, the display device 200 includes the display panel 100 in any one of the above embodiments.

In the above embodiments of the present disclosure, the drive mode of GIA is used in the display panel 100 of the display device 200, and the gate driving circuit(s) 20 are directly integrated in the display region AA, so that the area of the peripheral region of the display panel 100 occupied by the gate driving circuit(s) 20 may be saved, thereby reducing the width of the peripheral region, which is conducive to the narrow bezel of the display device 200.

Moreover, the first fan-out leads 50 and the data fan-out leads 30 in the display panel 100 are compactly arranged in the fan-out region FA, so that the utilization rate of the area of the fan-out region FA may be improved, thereby reducing the width of the fan-out region FA in the first direction X, which is conducive to the narrow bezel of the display device to which the display panel 100 is applied.

The display device 200 may be an electroluminescent display device, and the electroluminescent display device may be an OLED display device.

The display device 200 may be any device that displays images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display region, a fan-out region located on a side of the display region, a bonding region located on a side of the fan-out region away from the display region, and a peripheral region surrounding the display region, wherein the peripheral region includes a first sub-peripheral region, a second sub-peripheral region, a third sub-peripheral region and a fourth sub-peripheral region; the first sub-peripheral region and the second sub-peripheral region are respectively located on two opposite sides of the display region in a first direction, the third sub-peripheral region and the fourth sub-peripheral region are respectively located on two opposite sides of the display region in a second direction, and the first direction is substantially perpendicular to the second direction; and the fan-out region and the bonding region are located in the fourth sub-peripheral region;
the display panel comprising:
a plurality of data lines extending from the display region to the fan-out region;
a plurality of data fan-out leads disposed in the fan-out region; wherein each data line is electrically connected to a data fan-out lead; and the plurality of data fan-out leads are gathered to the bonding region;
a gate driving circuit disposed in the display region;
a plurality of control signal lines electrically connected to the gate driving circuit and configured to transmit respective control signals to the gate driving circuit; wherein the plurality of control signal lines extend from the display region to the fan-out region; and
a plurality of first fan-out leads disposed in the fan-out region; wherein each control signal line is electrically connected to a first fan-out lead; and the plurality of first fan-out leads are gathered to the bonding region; wherein
the control signal line includes a first line segment and a second line segment that are electrically connected to each other;
of first line segments of the plurality of control signal lines, some first line segments extend from the third sub-peripheral region, along the first sub-peripheral region, to the fan-out region;
some other first line segments extend from the third sub-peripheral region, along the second sub-peripheral region, to the fan-out region;
second line segments of the plurality of control signal lines extend from the display region to the third sub-peripheral region; and
an end of the first line segment is electrically connected to an end of the second line segment extending to the third sub-peripheral region, and another end of the first line segment is electrically connected to the first fan-out lead.

2. The display panel according to claim 1, wherein an end of the control signal line extending to the fan-out region is electrically connected to the first fan-out lead.

3. The display panel according to claim 2, further comprising:
a supply voltage bus disposed in the fan-out region and extending in the first direction; the first direction being substantially perpendicular to a direction from the display region to the fan-out region; wherein
the plurality of first fan-out leads and the supply voltage bus are made of a same material and arranged in a same layer, and the first fan-out lead bypasses one of two opposite sides of the supply voltage bus in the first direction, and extends to a side of the supply voltage bus away from the display region.

4. The display panel according to claim 3, further comprising:
a plurality of connection lines disposed between the supply voltage bus and the display region and extending in the first direction; the control signal line being electrically connected to the first fan-out lead through a connection line of the plurality of connection lines.

5. The display panel according to claim 4, wherein the display panel comprises:
a gate conductive layer, the plurality of first fan-out leads, the plurality of connection lines and the supply voltage bus being disposed in the gate conductive layer; and a source-drain conductive layer disposed on a side of the gate conductive layer away from a substrate of the display panel, the plurality of control signal lines, the plurality of data lines and the plurality of data fan-out leads being disposed in the source-drain conductive layer; or a gate conductive layer, the plurality of first fan-out leads, the plurality of connection lines and the supply voltage bus being disposed in the gate conductive layer; a source-drain conductive layer disposed on a side of the gate conductive layer away from a substrate of the display panel, the plurality of control signal lines, the plurality of data lines and the plurality of data fan-out leads being disposed in the source-drain conductive layer; and a first insulating layer disposed between the gate conductive layer and the source-drain conductive layer, the first insulating layer being provided with first vias therein; wherein the control signal line is electrically connected to the connection line through a first via of the first vias.

6. The display panel according to claim 5, wherein orthographic projections of the plurality of first fan-out leads on the substrate are staggered from orthographic projections of the plurality of data fan-out leads on the substrate.

7. The display panel according to claim 2, further comprising:
a supply voltage bus disposed in the fan-out region and extending in the first direction; the first direction being substantially perpendicular to a direction from the display region to the fan-out region; wherein
at least a portion of the first fan-out lead is arranged in a different layer from the supply voltage bus and the data fan-out leads; and
an orthographic projection of the first fan-out lead on a substrate of the display panel is partially overlapped with an orthographic projection of the supply voltage bus on the substrate.

8. The display panel according to claim 7, wherein the first fan-out lead includes a first lead segment and a second lead segment that are electrically connected to each other; wherein
the control signal line is electrically connected to an end of the first lead segment away from the second lead segment; and
an end of the second lead segment away from the first lead segment extends to the bonding region.

9. The display panel according to claim 8, wherein at least one first lead segment includes a first sub-lead segment and a second sub-lead segment that are electrically connected to each other; wherein
the first sub-lead segment extends in the first direction; and
the second sub-lead segment extends in the second direction.

10. The display panel according to claim 8, wherein the display panel comprises:
a gate conductive layer, the supply voltage bus being disposed in the gate conductive layer;
a source-drain conductive layer disposed on a side of the gate conductive layer away from the substrate, the plurality of control signal lines, the plurality of data lines and the plurality of data fan-out leads being disposed in the source-drain conductive layer; and
an electrode layer disposed on a side of the source-drain conductive layer away from the substrate;

wherein the first lead segment is disposed in the electrode layer, and the second lead segment is disposed in the source-drain conductive layer or the gate conductive layer;
an orthographic projection of the first lead segment on the substrate is partially overlapped with the orthographic projection of the supply voltage bus on the substrate, and is partially overlapped with the orthographic projection of the at least one data fan-out lead on the substrate; and
an orthographic projection of the second lead segment on the substrate is staggered from orthographic projections of the plurality of data fan-out leads on the substrate.

11. The display panel according to claim 10, further comprising:
a second insulating layer disposed between the source-drain conductive layer and the electrode layer; the second insulating layer being provided with second vias and third vias therein; wherein
the control signal line is electrically connected to the end of the first lead segment away from the second lead segment through a second via of the second vias; and
an end of the first lead segment proximate to the second lead segment is electrically connected to the second lead segment through a third via of the third vias; or the display panel further comprises a first insulating layer disposed between the gate conductive layer and the source-drain conductive layer, and the first insulating layer is provided with first vias therein; a first via of the first vias is communicated with a third via of the third vias, and an end of the first lead segment proximate to the second lead segment is electrically connected to the second lead segment through the third via and the first via.

12. The display panel according to claim 1, wherein the plurality of first fan-out leads, the plurality of control signal lines and the plurality of data fan-out leads are made of a same material, and are arranged in a same layer; and
the plurality of first fan-out leads are disposed on two opposite sides of the plurality of data fan-out leads in the first direction.

13. The display panel according to claim 12, further comprising:
a supply voltage bus disposed in the fan-out region and extending in the first direction; wherein
the plurality of first fan-out leads are arranged in a different layer from the supply voltage bus; and
an orthographic projection of the first fan-out lead on a substrate of the display panel is partially overlapped with an orthographic projection of the supply voltage bus on the substrate.

14. The display panel according to claim 13, wherein the display panel comprises:
a gate conductive layer, the supply voltage bus being disposed in the gate conductive layer; and
a source-drain conductive layer disposed on a side of the gate conductive layer away from the substrate of the display panel, the plurality of control signal lines, the plurality of data lines, the plurality of data fan-out leads and the plurality of first fan-out leads being disposed in the source-drain conductive layer.

15. The display panel according to claim 1, further comprising:
a supply voltage bus disposed in the fan-out region and extending in the first direction; wherein
the first line segments of the control signal lines, the plurality of first fan-out leads and the supply voltage bus are made of a same material and arranged in a same layer, the first fan-out lead bypasses one of two opposite sides of the supply voltage bus in the first direction, and extends to a side of the supply voltage bus away from the display region.

16. The display panel according to claim 15, wherein the display panel comprises:
   a gate conductive layer, the first line segments, the plurality of first fan-out leads and the supply voltage bus being disposed in the gate conductive layer; and
   a source-drain conductive layer disposed on a side of the gate conductive layer away from a substrate of the display panel, the second line segments of the control signal lines, the plurality of data lines and the plurality of data fan-out leads being disposed in the source-drain conductive layer.

17. The display panel according to claim 1, wherein the bonding region includes a first sub-bonding region, and two second sub-bonding regions respectively located on two opposite sides of the first sub-bonding region in the first direction; and the first direction is substantially perpendicular to a direction from the display region to the fan-out region; wherein
   the plurality of data fan-out leads are gathered to the first sub-bonding region; and
   the plurality of first fan-out leads are divided into two groups, and the two groups of first fan-out leads are gathered to the two second sub-bonding regions, respectively.

18. The display panel according to claim 17, further comprising:
   a plurality of pins configured to be bonded to a flexible printed circuit board; the plurality of pins including a plurality of first pins located in the first sub-bonding region, and a plurality of second pins located in the second sub-bonding regions; wherein
   a data fan-out lead of the plurality of data fan-out leads is electrically connected to at least one first pin; and a first fan-out lead of the plurality of first fan-out leads is electrically connected to at least one second pin.

19. A display device comprising the display panel according to claim 1.

* * * * *